(12) United States Patent
Hirasawa et al.

(10) Patent No.: US 10,784,642 B2
(45) Date of Patent: Sep. 22, 2020

(54) FLEXIBLE PRINTED WIRING BOARD, ELECTRONIC DEVICE HAVING FLEXIBLE PRINTED WIRING BOARD, AND METHOD FOR MANUFACTURING ELECTRONIC DEVICE HAVING FLEXIBLE PRINTED WIRING BOARD

(71) Applicant: IBIDEN CO., LTD., Ogaki (JP)

(72) Inventors: Takahisa Hirasawa, Ogaki (JP); Takayuki Furuno, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 91 days.

(21) Appl. No.: 16/049,904

(22) Filed: Jul. 31, 2018

(65) Prior Publication Data
US 2019/0036289 A1 Jan. 31, 2019

(30) Foreign Application Priority Data
Jul. 31, 2017 (JP) .................. 2017-148213

(51) Int. Cl.
| | |
|---|---|
| *H01R 43/20* | (2006.01) |
| *H05K 1/02* | (2006.01) |
| *H05K 1/09* | (2006.01) |
| *H05K 1/18* | (2006.01) |
| *H05K 3/00* | (2006.01) |
| *B23K 26/21* | (2014.01) |

(Continued)

(52) U.S. Cl.
CPC ........... *H01R 43/205* (2013.01); *B23K 26/21* (2015.10); *H01R 43/0221* (2013.01); *H05K 1/028* (2013.01); *H05K 1/09* (2013.01); *H05K 1/189* (2013.01); *H05K 3/005* (2013.01); *B23K 2101/36* (2018.08); *B23K 2103/05* (2018.08); *H01R 12/65* (2013.01); *H01R 43/0214* (2013.01); *H05K 3/328* (2013.01); *H05K 3/4046* (2013.01); *H05K 2201/0347* (2013.01); *H05K 2201/10037* (2013.01); *H05K 2201/10242* (2013.01); *H05K 2201/10295* (2013.01)

(58) Field of Classification Search
CPC .......................... H01R 12/65; H01R 43/0214; H01R 43/0221; H01R 43/205; H05K 1/09; H05K 1/89; H05K 3/005
See application file for complete search history.

(56) References Cited

U.S. PATENT DOCUMENTS

| | | | |
|---|---|---|---|
| 10,297,937 B2 * | 5/2019 | Hirasawa | ............... H05K 3/328 |
| 2005/0257952 A1 * | 11/2005 | Morimoto | .............. H05K 3/281 |
| | | | 174/256 |

(Continued)

FOREIGN PATENT DOCUMENTS

JP 2002-025653 A 1/2002

*Primary Examiner* — Amanda C. Walke
(74) *Attorney, Agent, or Firm* — Oblon, McClelland, Maier & Neustadt, L.L.P.

(57) ABSTRACT

A flexible printed wiring board includes a flexible insulating layer, a conductor layer formed on a surface of the flexible insulating layer, and a metal body having a columnar shape and fitted in a hole penetrating through the flexible insulating layer and the conductor layer such that the metal body is formed of a welding base material and has an end portion formed to be joined to an electrode of a battery by welding. The welding base material of the metal body of the flexible printed wiring board includes the same material as the electrode of the battery.

20 Claims, 4 Drawing Sheets

(51) Int. Cl.
*H01R 43/02* (2006.01)
*H01R 12/65* (2011.01)
*B23K 103/04* (2006.01)
*B23K 101/36* (2006.01)
*H05K 3/32* (2006.01)
*H05K 3/40* (2006.01)

(56) References Cited

U.S. PATENT DOCUMENTS

| | | | |
|---|---|---|---|
| 2007/0218257 A1* | 9/2007 | Ambo | H01R 9/2466 |
| | | | 428/209 |
| 2013/0029538 A1* | 1/2013 | Ihara | H01R 13/2442 |
| | | | 439/733.1 |
| 2014/0034373 A1* | 2/2014 | Yoshikawa | H01F 5/003 |
| | | | 174/260 |
| 2017/0223816 A1* | 8/2017 | Hirasawa | H05K 3/328 |

* cited by examiner

Cross-Sectional View along A-A' Line

FLEXIBLE PRINTED WIRING BOARD, ELECTRONIC DEVICE HAVING FLEXIBLE PRINTED WIRING BOARD, AND METHOD FOR MANUFACTURING ELECTRONIC DEVICE HAVING FLEXIBLE PRINTED WIRING BOARD

CROSS-REFERENCE TO RELATED APPLICATIONS

The present application is based upon and claims the benefit of priority to Japanese Patent Application No. 2017-148213, filed Jul. 31, 2017, the entire contents of which are incorporated herein by reference.

BACKGROUND OF THE INVENTION

Field of the Invention

The present invention relates to a flexible printed wiring board, an electronic device having the flexible printed wiring board, and a method for manufacturing the electronic device having the flexible printed wiring board.

Description of Background Art

Japanese Patent Laid-Open Publication No. 2002-25653 describes that an end portion of a metallic connection terminal having a joining end portion is arranged on a conductor pattern of a flexible substrate, and resistance welding is performed between the end portion of the connection terminal and the conductor pattern of the flexible substrate. The entire contents of this publication are incorporated herein by reference.

SUMMARY OF THE INVENTION

According to one aspect of the present invention, a flexible printed wiring board includes a flexible insulating layer, a conductor layer formed on a surface of the flexible insulating layer, and a metal body having a columnar shape and fitted in a hole penetrating through the flexible insulating layer and the conductor layer such that the metal body is formed of a welding base material and has an end portion formed to be joined to an electrode of a battery by welding. The welding base material of the metal body of the flexible printed wiring board includes the same material as the electrode of the battery.

According to another aspect of the present invention, an electronic device includes a battery having an electrode, and a flexible printed wiring board including a flexible insulating layer, a conductor layer formed on a surface of the flexible insulating layer, a metal body having a columnar shape and fitted in a hole penetrating through the flexible insulating layer and the conductor layer such that the metal body is formed of a welding base material and has an end portion joined to the electrode of the battery by welding. The welding base material of the metal body of the flexible printed wiring board includes the same material as the electrode of the battery.

According to yet another aspect of the present invention, a method for manufacturing an electronic device includes preparing a flexible printed wiring board including a flexible insulating layer, a conductor layer formed on a surface of the flexible insulating layer, a metal body having a columnar shape and fitted in a hole penetrating through the flexible insulating layer and the conductor layer such that the metal body is formed of a welding base material and has an end portion formed to be joined to an electrode of a battery by welding, welding the electrode of the battery to the end portion of the metal body such that the electrode of the battery is joined to the end portion of the metal body. The welding base material of the metal body of the flexible printed wiring board includes the same material as the electrode of the battery.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
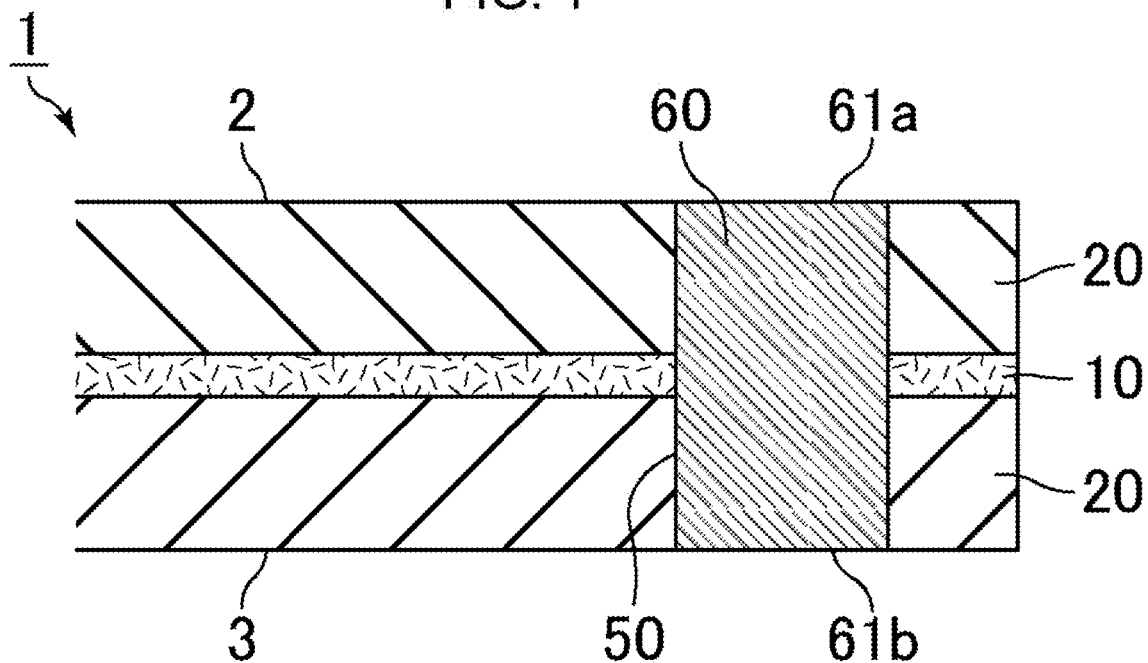
FIG. 1 is a cross-sectional view schematically illustrating a flexible printed wiring board according to an embodiment of the present invention.

Embodiments will now be described with reference to the accompanying drawings, wherein like reference numerals designate corresponding or identical elements throughout the various drawings.

FIG. 1 is a cross-sectional view schematically illustrating a flexible printed wiring board according to an embodiment of the present invention.

A flexible printed wiring board 1 illustrated in FIG. 1 includes a flexible insulating layer 10, and a conductor layer 20 formed on both sides of the flexible insulating layer 10, and has a first main surface 2 and a second main surface 3 which is on an opposite side with respect to the first main surface 2.

A hole 50 penetrating from the first main surface 2 to the second main surface 3 is formed in the flexible printed wiring board 1.

Further, a columnar metal body 60 is fitted in the hole 50. The metal body 60 has an end portion (61a) on the first main surface 2 side and an end portion (61b) on the second main surface 3 side.

The flexible insulating layer is preferably formed of an insulating resin. Examples of a material that forms the insulating resin include polyimide, glass epoxy, and the like. Among these materials, polyimide is preferred. When the insulating resin is polyimide, the insulating resin is both flexible and insulating. Therefore, a shape can be deformed according to an intended use, while sufficient insulation is ensured.

A thickness of the flexible insulating layer is not particularly limited, but is preferably 30-70 m. When the thickness of the flexible insulating layer is smaller than 30 μm, the flexible insulating layer easily bends, and further, since a substrate that easily bends is formed, bonding with a wiring or another member may be easily broken. On the other hand, when the thickness of the flexible insulating layer is larger than 70 m, when a hole is formed by punching in order to insert a metal body, a crack is likely to occur around the hole and reliability may decrease.

A conductor layer is formed on at least a surface on one side of the flexible insulating layer. FIG. 1 illustrates an example in which a conductor layer is formed on both sides of the flexible insulating layer.

A material that forms the conductor layer is not particularly limited, but is preferably copper, nickel or the like.

These materials have good electrical conductivity and can be suitably used as conductors.

A thickness of the conductor layer is not particularly limited, but is preferably larger than that of the flexible insulating layer. Further, the thickness of the conductor layer is preferably each 10-300 μm. When the thickness of the conductor layer is smaller than 10 μm, during handling, the conductor layer may be easily broken and a failure rate may increase. On the other hand, when the thickness of the conductor layer is greater than 300 μm, when the flexible printed wiring board is bent and used, due to the bending, a compressive stress applied from the conductor layer to the flexible printed wiring board is large and thus the flexible insulating layer may be easily broken.

The metal body is fitted in the hole penetrating from the first main surface to the second main surface of the flexible printed wiring board, and is a welding base material. This means that regardless of a form of a battery, the flexible printed wiring board itself has a structure capable of being welded.

The metal body is suitable for flowing a large current, and is suitable for welding with an electrode of a battery as compared to a case of a structure such as a through hole or a bottomed filled via that can be considered as a structure of a metal body.

Further, different from a filled via that is formed in a through hole through a chemical process such as plating, the metal body does not have voids formed therein and does not have concave or convex portions or the like on surfaces thereof. Since there are no voids formed inside the metal body, heat-transfer efficiency of the metal body is not reduced, and heat dissipation performance can be ensured. Further, the metal body is also preferable in that a conductor volume of the metal body can be easily increased as compared to a filled via.

Further, the metal body is not particularly limited in shape as long as the metal body has a columnar shape. For example, the metal body may have a shape of a circular cylinder, a quadrangular prism, a hexagonal prism, an octagonal prism, or the like.

In a flexible printed wiring board according to an embodiment of the present invention, the metal body preferably has a cross-sectional area of 0.05-3.2 mm$^2$. In the present specification, the "cross-sectional area of the metal body" means an area of a cross section of the metal body in a direction perpendicular to a height direction of the metal body.

When the cross-sectional area of the metal body is 0.05 mm$^2$ or more, resistance of the metal body itself is sufficiently small, and thus the metal body can be prevented from being melted and damaged by a current that is caused to flow for resistance welding.

A large metal body having a cross-sectional area exceeding 3.2 mm$^2$ may be easy to come off from the flexible printed wiring board.

As will be described later, a flexible printed wiring board according to an embodiment of the present invention is connected to a battery having an electrode. In this case, the end portion of the metal body on the second main surface side is connected to the electrode of the battery by welding, and the metal body serves as a welding base material in the welding.

Further, the metal body is formed of the same material as the electrode of the battery. Therefore, when the metal body and the electrode of the battery are joined by welding, joining strength of a welded portion between the metal body and the electrode of the battery becomes sufficiently strong.

The material of the metal body is not particularly limited as long as the material of the metal body is the same as that of the electrode of the battery. However, the metal body is preferably formed of stainless steel.

When the electrode of the battery is formed of stainless steel, strength and corrosion resistance of the battery are improved.

Further, when the metal body of the flexible printed wiring board is formed of stainless steel, joining strength of the metal body with the electrode formed of stainless steel becomes sufficiently strong.

Further, on the first main surface of a flexible printed wiring board according to an embodiment of the present invention, a metal plating layer is preferably formed so as to cover the end portion of the metal body on the first main surface side. Further, on the second main surface of a flexible printed wiring board according to an embodiment of the present invention, a metal plating layer is preferably formed so as to cover the end portion of the metal body on the second main surface side. Further, a metal plating layer is preferably formed on both the first main surface and the second main surface of the flexible printed wiring board.

When such a metal plating layer is formed, the metal body can be prevented from coming off from the first main surface side and/or the second main surface side of the flexible printed wiring board.

In a flexible printed wiring board according to an embodiment of the present invention, the metal plating layer is preferably a nickel plating layer.

A flexible printed wiring board in which such a metal plating layer is formed according to an embodiment of the present invention is described with reference to the drawings.

Figure 2:
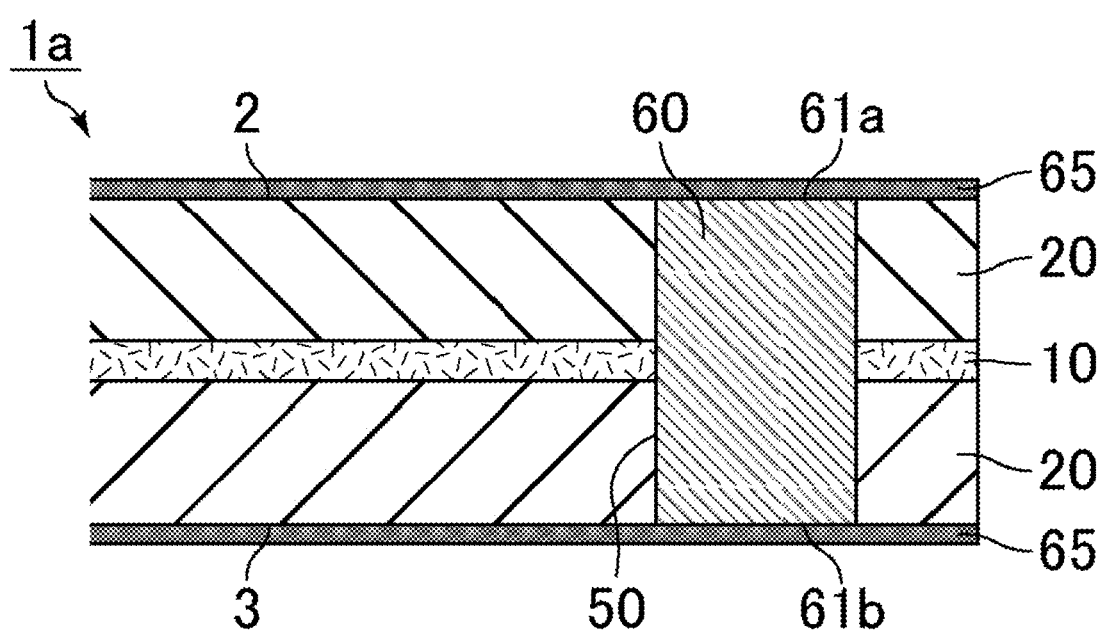
FIG. 2 is a cross-sectional view schematically illustrating a flexible printed wiring board according to an embodiment of the present invention.

FIG. 2 is a cross-sectional view schematically illustrating a flexible printed wiring board according to an embodiment of the present invention.

A flexible printed wiring board (1a) illustrated in FIG. 2 includes a flexible insulating layer 10, and a conductor layer 20 formed on both sides of the flexible insulating layer 10, and has a first main surface 2 and a second main surface 3 which is on an opposite side with respect to the first main surface 2.

A hole 50 penetrating from the first main surface 2 to the second main surface 3 is formed in the flexible printed wiring board (1a).

Further, a columnar metal body 60 is fitted in the hole 50. The metal body 60 has an end portion (61a) on the first main surface 2 side and an end portion (61b) on the second main surface 3 side.

In the flexible printed wiring board (1a), on the first main surface 2 and the second main surface 3, a metal plating layer 65 is formed so as to cover the end portions (61a, 61b) of the metal body 60.

Next, an electronic device having a flexible printed wiring board according to an embodiment of the present invention (hereinafter, also referred to as an electronic device according to an embodiment of the present invention or the electronic device) is described.

An electronic device according to an embodiment of the present invention is an electronic device that includes a battery having an electrode, and a flexible printed wiring board according to an embodiment of the present invention. The end portion of the metal body on the second main surface side of the flexible printed wiring board is joined to the electrode of the battery by welding.

Further, the metal body of the flexible printed wiring board and the electrode of the battery are formed of the same material.

Therefore, joining strength of a welded portion between the metal body and the electrode of the battery becomes sufficiently strong.

The term "joining" in an electronic device according to an embodiment of the present invention means that the metal body of the flexible printed wiring board and the electrode of the battery are joined by welding without using a member such as solder. Examples of the welding include resistance welding and laser welding.

In an electronic device according to an embodiment of the present invention, the material of the metal body of the flexible printed wiring board and the material of the electrode of the battery are not particularly limited as long as the material of the metal body of the flexible printed wiring board and the material of the electrode of the battery are the same material. However, the metal body of the flexible printed wiring board and the electrode of the battery are preferably formed of stainless steel. Further, in this case, it is more preferable that a metal plating layer is formed on the electrode of the battery.

When the electrode of the battery is formed of stainless steel, strength and corrosion resistance of the battery are improved.

Further, in an electronic device according to an embodiment of the present invention, when the material of the metal body of the flexible printed wiring board and the material of the electrode of the battery are stainless steel, the metal body of the flexible printed wiring board and the electrode of the battery are preferably joined by welding via nickel.

When the metal body of the flexible printed wiring board and the electrode of the battery are joined by welding via nickel, nickel and stainless steel form an alloy. When such an alloy is formed, the joining strength of the welded portion is improved.

That is, in an electronic device according to an embodiment of the present invention, a stainless steel-nickel alloy layer is preferably formed between the metal body of the flexible printed wiring board and the electrode of the battery.

An example of a method for forming such a stainless steel-nickel alloy layer is a method in which, after a metal plating layer is formed on an end portion of the metal body of the flexible printed wiring board and a metal plating layer is formed on a surface of the electrode of the battery, the metal body of the flexible printed wiring board and the electrode of the battery are joined by welding.

In an electronic device according to an embodiment of the present invention, as long as the material of the metal body of the flexible printed wiring board and the material of the electrode of the battery are the same material, any kind of a battery may be used.

In the following, an electronic device according to an embodiment of the present invention is described with reference to the drawings.

Figure 3:
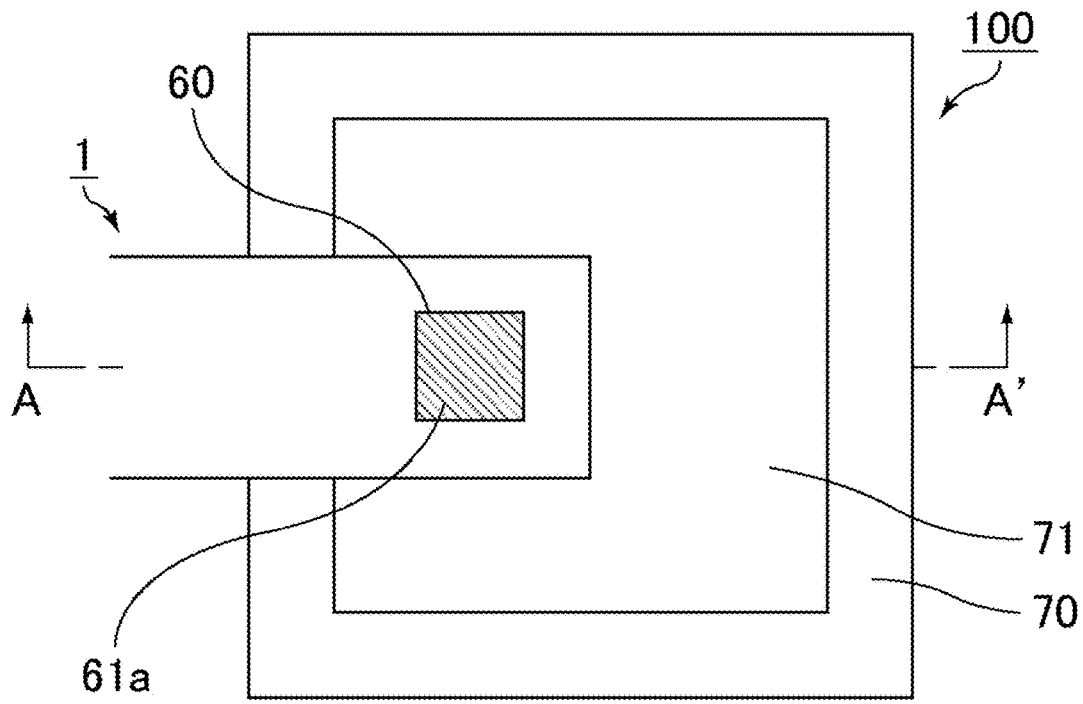
FIG. 3 is a top view schematically illustrating an electronic device according to an embodiment of the present invention.
Figure 4:
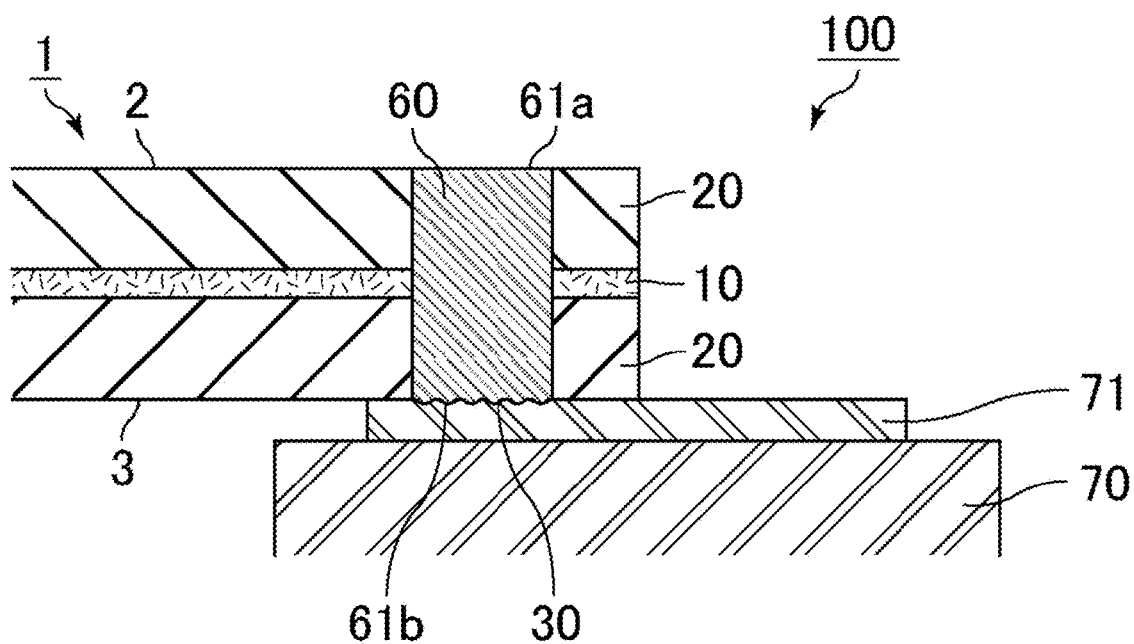
FIG. 4 is a cross-sectional view schematically illustrating an electronic device according to an embodiment of the present invention, and is a cross-sectional view along an A-A' line in FIG. 3.

FIG. 3 is a top view schematically illustrating an electronic device according to an embodiment of the present invention. FIG. 4 is a cross-sectional view schematically illustrating an electronic device according to an embodiment of the present invention, and is a cross-sectional view along an A-A' line in FIG. 3.

An electronic device 100 illustrated in FIGS. 3 and 4 includes a battery 70 having an electrode 71, and the flexible printed wiring board 1.

Further, the end portion (61b) of the metal body 60 of the flexible printed wiring board 1 and the electrode 71 of the battery 70 are joined by resistance welding, and a welded portion 30 (portion indicated by a wavy line in FIG. 4) is formed.

FIG. 4 illustrates a case where the entire end portion (61b) of the metal body 60 is the welded portion 30.

Further, a portion of the electrode 71 of the battery 70 to which the end portion (61b) of the metal body 60 is welded is not particularly limited.

In the following, a method for manufacturing a flexible printed wiring board according to an embodiment of the present invention and a method for manufacturing an electronic device having a flexible printed wiring board according to an embodiment of the present invention are described.

Method for Manufacturing Flexible Printed Wiring Board

FIG. 5A-5D are process diagrams schematically illustrating a method for manufacturing the flexible printed wiring board according to an embodiment of the present invention.

(1) Conductor Substrate Preparation Process

First, as a conductor substrate preparation process, a conductor substrate is prepared in which a conductor layer is formed on at least a surface on one side of a flexible insulating layer.

Figure 5A:
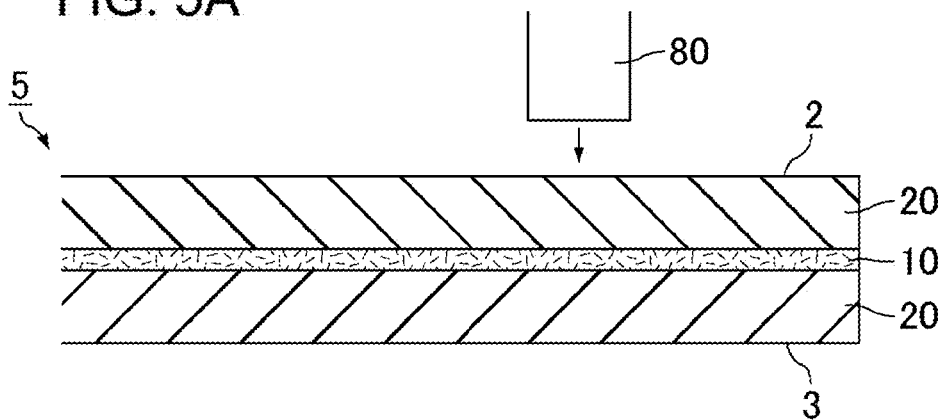
FIG. 5A-5D are process diagrams schematically illustrating a method for manufacturing a flexible printed wiring board according to an embodiment of the present invention.

FIG. 5A illustrates a process of preparing a double-sided conductor substrate 5 in which a conductor layer 20 is formed on both sides of a flexible insulating layer 10 formed of an insulating resin, and which has a first main surface 2 and a second main surface 3 which is on an opposite side with respect to the first main surface 2.

Materials that form the flexible insulating layer 10 and the conductor layer 20 are the same as those described in the description of the flexible printed wiring board and thus a description thereof is omitted.

(2) Hole Formation Process

Next, a hole 50 penetrating from the first main surface 2 to the second main surface 3 is formed. The hole 50 also penetrates the flexible insulating layer 10 and the conductor layer 20.

The hole is preferably formed by punching, and FIG. 5A illustrates a state in which a punch 80 used in punching is arranged on the first main surface 2 side.

Figure 5B:
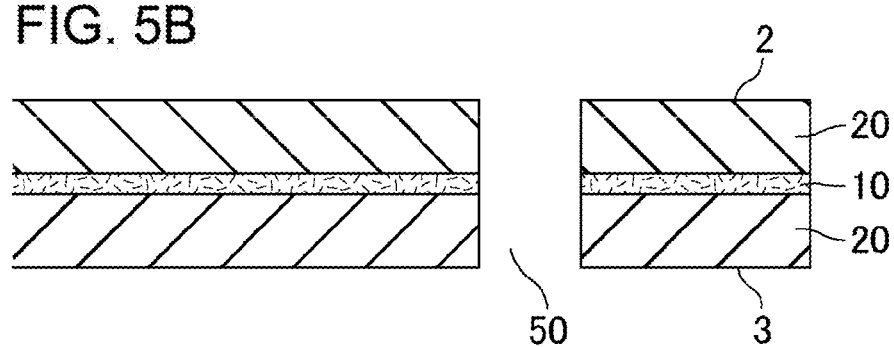

FIG. 5B illustrates the double-sided conductor substrate in which the hole 50 is formed.

(3) Metal Body Insertion Process

Next, by inserting the metal body into the hole, the metal body is fitted into the hole. The insertion of the metal body is preferably performed from an opposite side with respect to the side where the punching is performed.

Figure 5C:
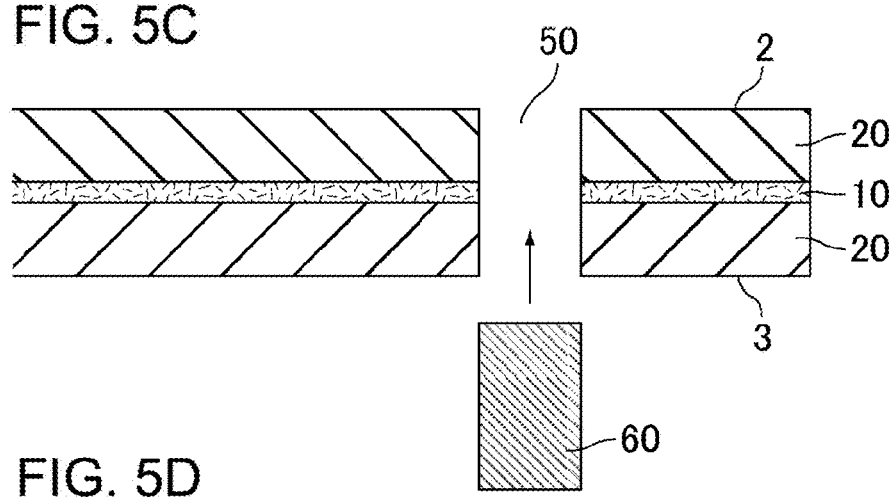

FIG. 5C illustrates an example in which the metal body 60 is inserted into the hole 50 from the second conductor layer 3 side.

When desired, it is preferable to perform pattern formation with respect to the conductor layer to form desired wirings.

Further, when desired, prior to performing pattern formation with respect to the conductor layer, it is preferable to form a metal plating layer on the main surfaces of the flexible printed wiring board so as to cover the end portions of the metal body.

Further, it is also preferable to perform coining to improve flatness of the end portions of the metal body.

Figure 5D:
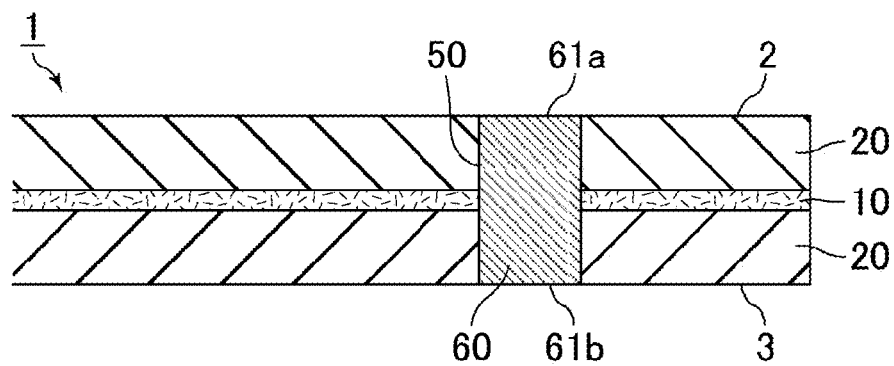

By the above-described processes, the flexible printed wiring board as illustrated in FIG. 5D can be manufactured.

Method for Manufacturing Electronic Device Having Flexible Printed Wiring Board

A method for manufacturing an electronic device according to an embodiment of the present invention is a method for manufacturing an electronic device that is obtained by connecting a battery having an electrode to a flexible printed wiring board according to an embodiment of the present invention. The method includes a process in which the end portion of the metal body on the second main surface side of the flexible printed wiring board and the electrode of the battery are joined by welding, the metal body of the flexible printed wiring board and the electrode of the battery being formed of the same material.

In a method for manufacturing an electronic device according to an embodiment of the present invention, the metal body and the electrode of the battery are formed of the same material.

Therefore, in the manufactured electronic device, joining strength of a welded portion between the metal body and the electrode of the battery becomes sufficiently strong.

In a method for manufacturing an electronic device according to an embodiment of the present invention, a method for welding is not particularly limited. For example, welding methods such as resistance welding, laser welding, and the like can be adopted.

In the following, a method for manufacturing an electronic device by resistance welding is described.

In the case of manufacturing an electronic device according to an embodiment of the present invention by resistance welding, first, the end portion of the metal body on the second main surface side of the flexible printed wiring board is brought into contact with the electrode of the battery.

Then, welding tools of a resistance welding machine are respectively arranged on the end portion of the metal body on the first main surface side of the flexible printed wiring board and on the electrode of the battery.

Since the metal body of the flexible printed wiring board penetrates the flexible insulating layer and the conductor layer, by bringing the welding tool of the resistance welding machine into contact with the end portion of the metal body on the first main surface side of the flexible printed wiring board, a current can be caused to flow toward the end portion on the second main surface side. When the end portion of the metal body on the second main surface side of the flexible printed wiring board is kept in contact with the electrode of the battery, heat is generated due to interface resistance at a contact surface between a bottom surface of the end portion of the metal body on the second main surface side of the flexible printed wiring board and the electrode of the battery, and the metal body and the electrode of the battery melt due to the heat, and resistance welding is performed. As a result, the end portion of the metal body on the second main surface side of the flexible printed wiring board is joined to the electrode of the battery by resistance welding.

Further, since the portions welded by resistance welding are formed of the same material, the joining strength of the welded portion becomes sufficiently strong.

Here, a diameter of the metal body is preferably larger than a diameter of the welding tool on a plane on which the metal body and the welding tool are in contact with each other, and the entire contact surface of the welding tool is preferably placed within the bottom surface of the metal body such that the contact surface of the welding tool does not come out from a peripheral edge of the bottom surface of the metal body.

Further, of the welding tools of the resistance welding machine, one welding tool is in contact with a surface on one side of the metal body, but a position of the other welding tool is not particularly limited as long as the position allows resistance welding to be performed. The other welding tool is preferably brought into contact with a part of another component.

A method for manufacturing an electronic device having a flexible printed wiring board according to an embodiment of the present invention is described in detail using the drawings.

Figure 6:
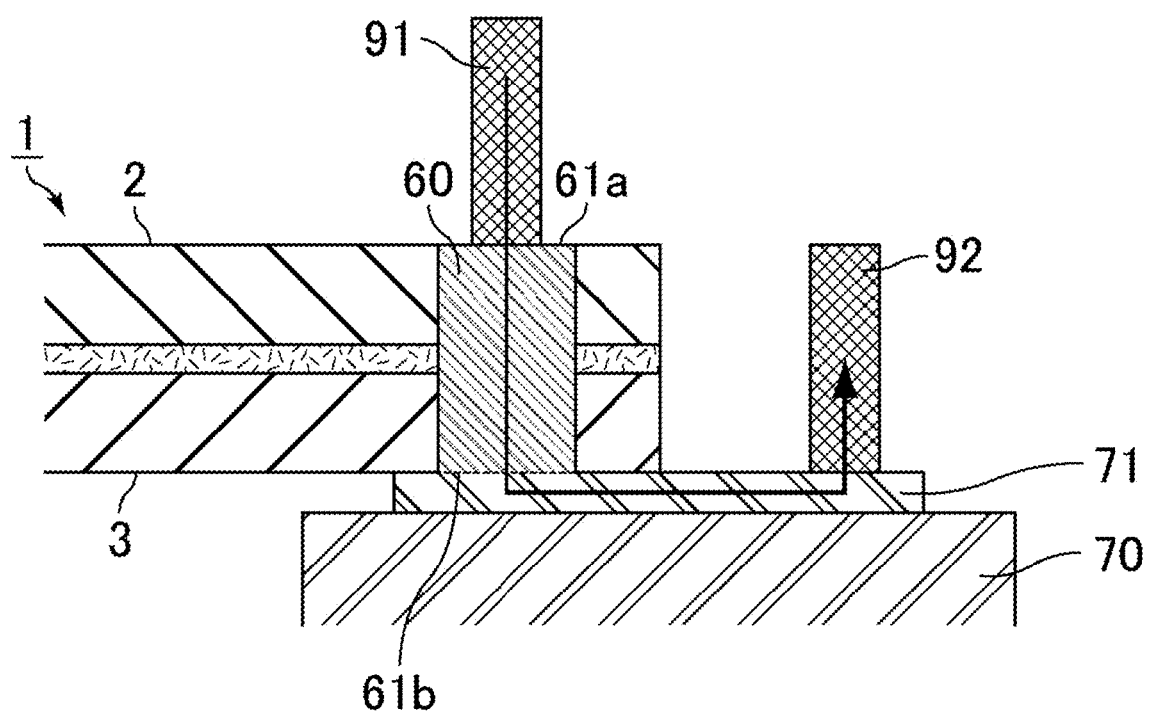
FIG. 6 is a cross-sectional view schematically illustrating how resistance welding is performed by bringing a welding tool of a resistance welding machine into contact with a bottom surface on one side of a metal body of a flexible printed wiring board.

FIG. 6 is a cross-sectional view schematically how resistance welding is performed by bringing a welding tool of a resistance welding machine into contact with a surface on one side of the metal body of the flexible printed wiring board, and schematically illustrates how resistance welding is performed when the electronic device illustrated in the state illustrated in FIG. 4 is manufactured.

In FIG. 6, a welding tool 91 of a resistance welding machine is in contact with the end portion (61a) of the metal body 60 on the first main surface 2 side of the flexible printed wiring board 1, and the end portion (61b) of the metal body 60 on the second main surface 3 side is in contact with the electrode 71 of the battery 70. Further, a welding tool 92 which is the other welding tool of the resistance welding machine is in contact with the electrode 71 of the battery 70, and a current can flow in a direction indicated by an arrow in FIG. 6.

In Japanese Patent Laid-Open Publication No. 2002-25653, the end portion of the connection terminal and the conductor pattern of the flexible substrate are joined by welding. However, since materials of welded portions are different, there is a concern that joining strength of the welded portions may become weak.

A flexible printed wiring board according to an embodiment of the present invention includes a flexible insulating layer, and a conductor layer formed on at least a surface on one side of the flexible insulating layer, and has a first main surface and a second main surface which is on an opposite side with respect to the first main surface. A hole penetrating from the first main surface to the second main surface is formed in the flexible printed wiring board. A columnar metal body is fitted in the hole. An end portion of the metal body on the second main surface side is connected to an electrode of a battery by welding. In the welding, the metal body serves as a welding base material. The metal body is formed of the same material as the electrode of the battery.

An electronic device board according to an embodiment of the present invention includes a battery having an electrode and a flexible printed wiring board according to an embodiment of the present invention. The metal body of the flexible printed wiring board and the electrode of the battery are formed of the same material. The end portion of the metal body on the second main surface side of the flexible printed wiring board is joined to the electrode of the battery by welding.

A method for manufacturing an electronic device according to an embodiment of the present invention is a method for manufacturing an electronic device that is obtained by connecting a battery having an electrode to a flexible printed wiring board according to an embodiment of the present invention. The method includes a process in which the end portion of the metal body on the second main surface side of the flexible printed wiring board and the electrode of the battery are joined by welding, the metal body of the flexible printed wiring board and the electrode of the battery being formed of the same material.

Obviously, numerous modifications and variations of the present invention are possible in light of the above teachings. It is therefore to be understood that within the scope of the appended claims, the invention may be practiced otherwise than as specifically described herein.

The invention claimed is:

1. A flexible printed wiring board, comprising:
   a flexible insulating layer;
   a conductor layer formed on a surface of the flexible insulating layer;
   a metal body having a columnar shape and fitted in a hole penetrating through the flexible insulating layer and the conductor layer such that the metal body comprises a welding base material and has an end portion configured to be joined to an electrode of a battery by welding; and
   a metal plating layer formed on the conductor layer such that the metal plating layer is covering the end portion of the metal body,
   wherein the welding base material of the metal body of the flexible printed wiring board comprises a same material as the electrode of the battery.

2. A flexible printed wiring board according to claim 1, wherein the metal body has a cross-sectional area in a range of 0.05 mm² to 3.2 mm².

3. A flexible printed wiring board according to claim 2, wherein the metal body comprises stainless steel.

4. A flexible printed wiring board according to claim 2, further comprising:
   a second conductor layer laminated on a second surface of the flexible insulating layer such that the second conductor layer is formed on an opposite side with respect to the conductor layer formed on the surface of the flexible insulating layer,
   wherein the metal body is fitted in the hole penetrating through the conductor layer, the flexible insulating layer and the second conductor layer such that the metal body has a second end portion on an opposite side with respect to the end portion configured to be joined to the electrode of the battery.

5. A flexible printed wiring board according to claim 4, further comprising:
   a second metal plating layer formed on the second conductor layer such that the second metal plating layer is covering the second end portion of the metal body.

6. A flexible printed wiring board according to claim 2, wherein the metal plating layer includes a nickel plating layer.

7. A flexible printed wiring board according to claim 1, wherein the metal body comprises stainless steel.

8. A flexible printed wiring board according to claim 7, further comprising:
   a second conductor layer laminated on a second surface of the flexible insulating layer such that the second conductor layer is formed on an opposite side with respect to the conductor layer formed on the surface of the flexible insulating layer,
   wherein the metal body is fitted in the hole penetrating through the conductor layer, the flexible insulating layer and the second conductor layer such that the metal body has a second end portion on an opposite side with respect to the end portion configured to be joined to the electrode of the battery.

9. A flexible printed wiring board according to claim 8, further comprising:
   a second metal plating layer formed on the second conductor layer such that the second metal plating layer is covering the second end portion of the metal body.

10. A flexible printed wiring board according to claim 1, further comprising:
    a second conductor layer laminated on a second surface of the flexible insulating layer such that the second conductor layer is formed on an opposite side with respect to the conductor layer formed on the surface of the flexible insulating layer,
    wherein the metal body is fitted in the hole penetrating through the conductor layer, the flexible insulating layer and the second conductor layer such that the metal body has a second end portion on an opposite side with respect to the end portion configured to be joined to the electrode of the battery.

11. A flexible printed wiring board according to claim 10, further comprising:
    a second metal plating layer formed on the second conductor layer such that the second metal plating layer is covering the second end portion of the metal body.

12. A flexible printed wiring board according to claim 1, wherein the metal plating layer is a nickel plating layer.

13. A flexible printed wiring board according to claim 1, wherein the metal plating layer includes a nickel plating layer.

14. An electronic device, comprising:
    a battery having an electrode; and
    the flexible printed wiring board of claim 1.

15. An electronic device according to claim 14, wherein the welding base material of the metal body of the flexible printed wiring board and the electrode of the battery are stainless steel.

16. A method for manufacturing an electronic device, comprising:
    preparing the flexible printed wiring board of claim 1; and
    welding the electrode of the battery to the end portion of the metal body such that the electrode of the battery is joined to the end portion of the metal body.

17. A method for manufacturing an electronic device according to claim 16, wherein the welding base material of the metal body of the flexible printed wiring board and the electrode of the battery are stainless steel.

18. A flexible printed wiring board, comprising:
    a flexible insulating layer;
    a conductor layer formed on a surface of the flexible insulating layer; and
    a metal body having a columnar shape and fitted in a hole penetrating through the flexible insulating layer and the conductor layer such that the metal body comprises a welding base material and has an end portion configured to be joined to an electrode of a battery by welding, wherein the welding base material of the metal body of the flexible printed wiring board comprises a same material as the electrode of the battery, and the metal body has a cross-sectional area in a range of 0.05 mm² to 3.2 mm².

19. A flexible printed wiring board, comprising:
a flexible insulating layer;
a conductor layer formed on a surface of the flexible insulating layer; and
a metal body having a columnar shape and fitted in a hole penetrating through the flexible insulating layer and the conductor layer such that the metal body comprises a welding base material and has an end portion configured to be joined to an electrode of a battery by welding,
wherein the welding base material of the metal body of the flexible printed wiring board comprises a same material as the electrode of the battery, and the metal body comprises stainless steel.

20. A flexible printed wiring board according to claim 19, wherein the metal body has a cross-sectional area in a range of 0.05 mm² to 3.2 mm².

\* \* \* \* \*